US010115602B2

(12) United States Patent
Jung et al.

(10) Patent No.: US 10,115,602 B2
(45) Date of Patent: Oct. 30, 2018

(54) METHOD OF MANUFACTURING SEMICONDUCTOR DEVICES

(71) Applicants: Seung Jae Jung, Suwon-si (KR); Sang Joon Yoon, Yongin-si (KR); Yong Hyun Kwon, Hwaseong-si (KR); Dae Hyun Jang, Hwaseong-si (KR); Ha Na Kim, Seoul (KR)

(72) Inventors: Seung Jae Jung, Suwon-si (KR); Sang Joon Yoon, Yongin-si (KR); Yong Hyun Kwon, Hwaseong-si (KR); Dae Hyun Jang, Hwaseong-si (KR); Ha Na Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 10 days.

(21) Appl. No.: 15/444,597

(22) Filed: Feb. 28, 2017

(65) Prior Publication Data
US 2018/0033639 A1 Feb. 1, 2018

(30) Foreign Application Priority Data

Jul. 27, 2016 (KR) .................. 10-2016-0095729

(51) Int. Cl.
H01L 21/311 (2006.01)
H01L 21/3065 (2006.01)
(Continued)

(52) U.S. Cl.
CPC .... H01L 21/31144 (2013.01); H01L 21/3081 (2013.01); H01L 21/3083 (2013.01); H01L 21/30655 (2013.01); H01L 21/31116 (2013.01); H01L 27/115 (2013.01); H01L 29/1037 (2013.01); H01L 27/11556 (2013.01); H01L 27/11582 (2013.01)

(58) Field of Classification Search
CPC ......... H01L 21/02063; H01L 21/28273; H01L 21/28282; H01L 21/31116; H01L 21/31144; H01L 27/11524; H01L 27/11556; H01L 27/1157; H01L 27/11582
USPC .................................................. 438/264, 268
See application file for complete search history.

(56) References Cited

U.S. PATENT DOCUMENTS 6,630,410 B2 10/2003 Trapp et al.
7,153,743 B2 12/2006 Koh
(Continued)

FOREIGN PATENT DOCUMENTS

JP 2011-096788 A 5/2011
KR 10-2005-0041263 A 5/2005
(Continued)

Primary Examiner — Edward Chin
(74) Attorney, Agent, or Firm — Myers Bigel, P.A.

(57) ABSTRACT

A method of manufacturing a semiconductor device includes alternately stacking mold insulating layers and sacrificial layers on a substrate; forming channel holes penetrating through the mold insulating layers and the sacrificial layers and allowing recessed regions to be formed in the substrate; cleaning a surface of the recessed regions in such a manner that processes of forming a first protective layer in an upper region of the channel holes and performing an anisotropic dry etching process on the recessed regions in a lower portion of the channel holes are alternately repeated one or more times, in-situ; and forming epitaxial layers on the recessed regions of the substrate.

9 Claims, 20 Drawing Sheets

(51) Int. Cl.
  *H01L 21/308* (2006.01)
  *H01L 27/115* (2017.01)
  *H01L 29/10* (2006.01)
  H01L 27/11556 (2017.01)
  H01L 27/11582 (2017.01)

(56) References Cited

U.S. PATENT DOCUMENTS

| | | |
|---|---|---|
| 7,622,394 B2 | 11/2009 | Ikegami |
| 8,298,949 B2 | 10/2012 | Zhong et al. |
| 8,906,760 B2 | 12/2014 | Ranjan et al. |
| 8,975,188 B2 | 3/2015 | Hirayama et al. |
| 2007/0020936 A1* | 1/2007 | Abatchev .......... H01L 21/30655 438/689 |
| 2007/0202700 A1 | 8/2007 | Leucke et al. |
| 2010/0060553 A1* | 3/2010 | Zimmerman ....... H01L 25/0753 345/60 |
| 2013/0237059 A1 | 9/2013 | Ranjan et al. |
| 2015/0145028 A1 | 5/2015 | Laven et al. |
| 2015/0303069 A1 | 10/2015 | Narishige et al. |
| 2016/0035742 A1* | 2/2016 | Kanakamedala . H01L 27/11582 438/264 |
| 2017/0103997 A1* | 4/2017 | Lee .................... H01L 21/0243 |

FOREIGN PATENT DOCUMENTS

| | | |
|---|---|---|
| KR | 10-2006-0039264 A | 5/2006 |
| KR | 10-2009-0098281 A | 9/2009 |
| KR | 10-2010-0011483 A | 2/2010 |
| KR | 10-2011-0011862 A | 2/2011 |
| KR | 10-2013-0102503 | 3/2013 |

\* cited by examiner

METHOD OF MANUFACTURING SEMICONDUCTOR DEVICES

CROSS-REFERENCE TO RELATED APPLICATION

This application claims benefit of priority to Korean Patent Application No. 10-2016-0095729 filed on Jul. 27, 2016 in the Korean Intellectual Property Office, the disclosure of which is incorporated herein by reference in its entirety.

BACKGROUND

1. Field

The present disclosure relates to a method of manufacturing semiconductor devices.

2. Description of Related Art

Electronic products have gradually decreased in size, but are still expected to process high-capacity data. Therefore, it may be desirable to increase a degree of integration in semiconductor devices used in electronic products. In order to increase the degree of integration in semiconductor devices, semiconductor devices having a vertical transistor structure, rather than a planar transistor structure, has been proposed.

SUMMARY

Aspects of the present disclosure may provide a method of manufacturing semiconductor devices having improved reliability.

According to an aspect of the present disclosure, a method of manufacturing a semiconductor device may include alternately stacking mold insulating layers and sacrificial layers on a substrate; forming channel holes penetrating through the mold insulating layers and the sacrificial layers and allowing recessed regions to be formed in the substrate; cleaning a surface of the recessed regions in such a manner that processes of forming a first protective layer in an upper region of the channel holes and performing an anisotropic dry etching process on the recessed regions in a lower portion of the channel holes may be alternately repeated one or more times, in-situ; and forming epitaxial layers on the recessed regions of the substrate.

According to an aspect of the present disclosure, a method of manufacturing a semiconductor device may include alternately stacking mold insulating layers and sacrificial layers on a substrate; forming channel holes penetrating through the mold insulating layers and the sacrificial layers and allowing recessed regions to be formed in the substrate; cleaning a surface of the recessed regions in such a manner that processes of forming a first protective layer in an upper region of the channel holes and performing an anisotropic dry etching process on the recessed regions may be alternately repeated one or more times, in-situ; forming an epitaxial layer in the recessed regions of the substrate; forming a gate dielectric layer and a first semiconductor layer, covering a side wall of the channel hole and a top surface of the epitaxial layer; forming a spacer on the gate dielectric layer in such a manner that processes of forming a second protective layer in the upper region of the channel holes and performing the anisotropic dry etching process on the first semiconductor layer may be alternately repeated one or more times, in-situ; removing a portion of the gate dielectric layer on the top surface of the epitaxial layer in such a manner that processes of forming a third protective layer in the upper region of the channel holes and performing the anisotropic dry etching process on the gate dielectric layer using the spacer as an etching mask may be alternately repeated one or more times, in-situ; and forming second semiconductor layers connected to the epitaxial layer in the channel holes.

According to an aspect of the present disclosure, a method of manufacturing a semiconductor device may include stacking, on a substrate, mold insulating layers and sacrificial layers in an alternating fashion. A channel hole may be formed that extends through each of the mold insulating layers, each of the sacrificial layers, and beyond a top surface of the substrate. In the channel hole, an epitaxial layer may be formed that extends both above and below the top surface of the substrate. On a side wall of the channel hole, a channel layer may be formed, and on a side wall of the channel layer, a gate dielectric layer may be formed. The gate dielectric layer may include a tunneling layer, a charge trapping layer, and a blocking layer.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Hereinafter, with reference to the attached drawings, aspects of the present disclosure will be described below.

Figure 1:
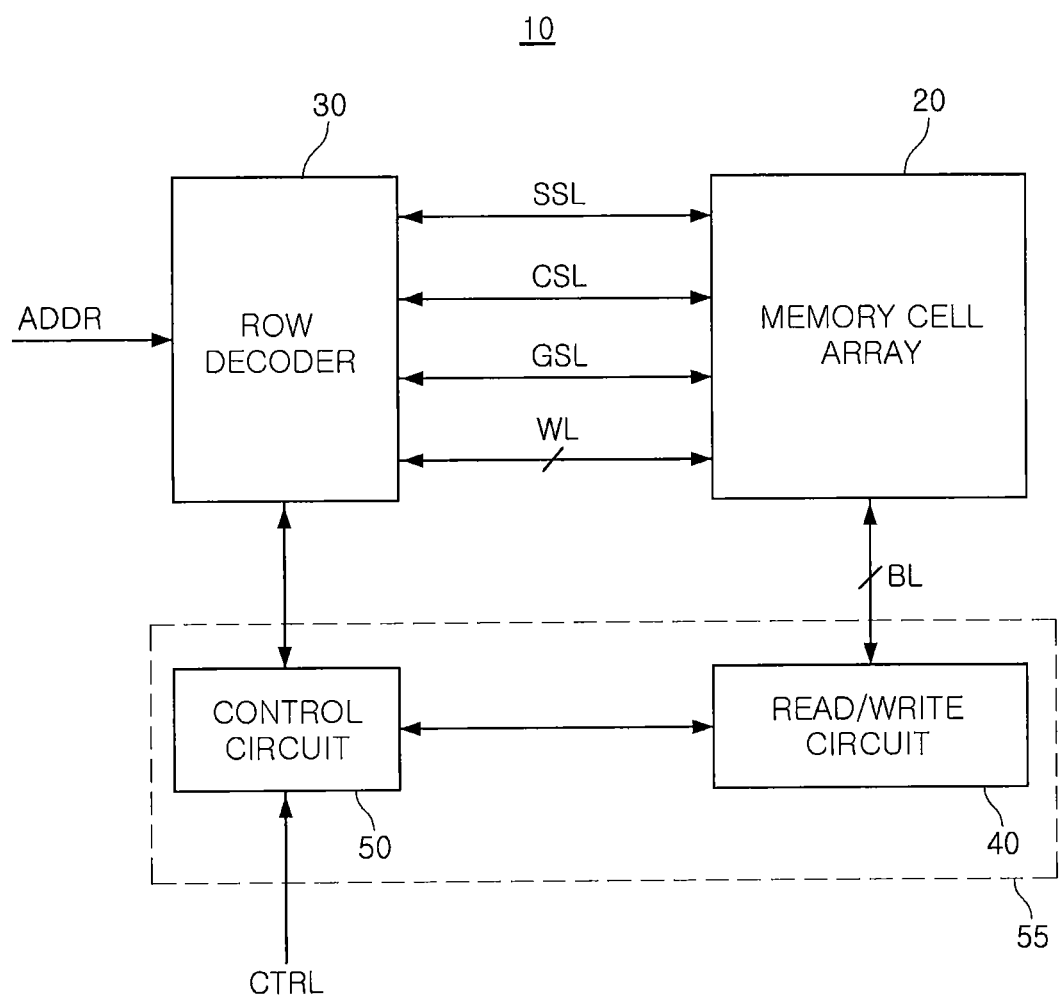
FIG. 1 is a schematic block diagram of a semiconductor device according to aspects of the present disclosure.

FIG. 1 is a schematic block diagram of a semiconductor device according to aspects of the present disclosure.

With reference to FIG. 1, a semiconductor device 10 according to an example embodiment may include a memory cell array 20, a row decoder 30, and a core logic circuit 55. The core logic circuit 55 may include a read/write circuit 40 and a control circuit 50.

The memory cell array 20 may include a plurality of memory cells arrayed in a plurality of rows and columns. The plurality of memory cells included in the memory cell array 20 may be connected to the row decoder 30 through a word line (WL), a common source line (CSL), a string select line (SSL), a ground select line (GSL), or the like, and may be connected to the read/write circuit 40 through a bit line (BL). In an example embodiment, the plurality of memory cells arrayed in the same row may be connected to the same WL, while the plurality of memory cells arrayed in the same column may be connected to the same BL.

The plurality of memory cells included in the memory cell array 20 may be divided into a plurality of memory blocks. Respective memory blocks may include a plurality of WLs, a plurality of SSLs, a plurality of GSLs, a plurality of BLs, and at least one CSL.

The row decoder 30 may receive address information from an external source and may decode the received address information, thus selecting at least one portion of the WL, the CSL, the SSL, and the GSL, connected to the memory cell array 20.

The read/write circuit 40 may select at least one portion of the BLs connected to the memory cell array 20 according to a command received by the control circuit 50. The read/write circuit 40 may read data stored in a memory cell connected to at least one selected portion of the BLs or may record data in the memory cell connected to the at least one selected portion of the BLs. In order to perform operations as described above, the read/write circuit 40 may include a circuit, such as a page buffer, an input/output buffer, a data latch, and the like.

The control circuit 50 may control an operation of the row decoder 30 and the read/write circuit 40 in response to a control signal CTRL transmitted from an external source. In a case in which data stored in the memory cell array 20 is read, the control circuit 50 may control the operation of the row decoder 30 to allow a voltage required for a read operation to be supplied to the WL connected to a memory cell storing the data to be read. In a case in which the voltage required for the read operation is supplied to a specific WL, the control circuit 50 may control to allow the read/write circuit 40 to read data stored in the memory cell connected to the WL receiving the voltage required for the read operation.

Additionally and/or alternatively, in a case in which data is written to the memory cell array 20, the control circuit 50 may control the operation of the row decoder 30 to allow a voltage required for a write operation to be supplied to the WL connected to a memory cell to write the data. In a case in which the voltage required for the write operation is supplied to a specific WL, the control circuit 50 may control the read/write circuit 40 to allow data to be written to the memory cell connected to the WL receiving the voltage required for the write operation.

Figure 2:
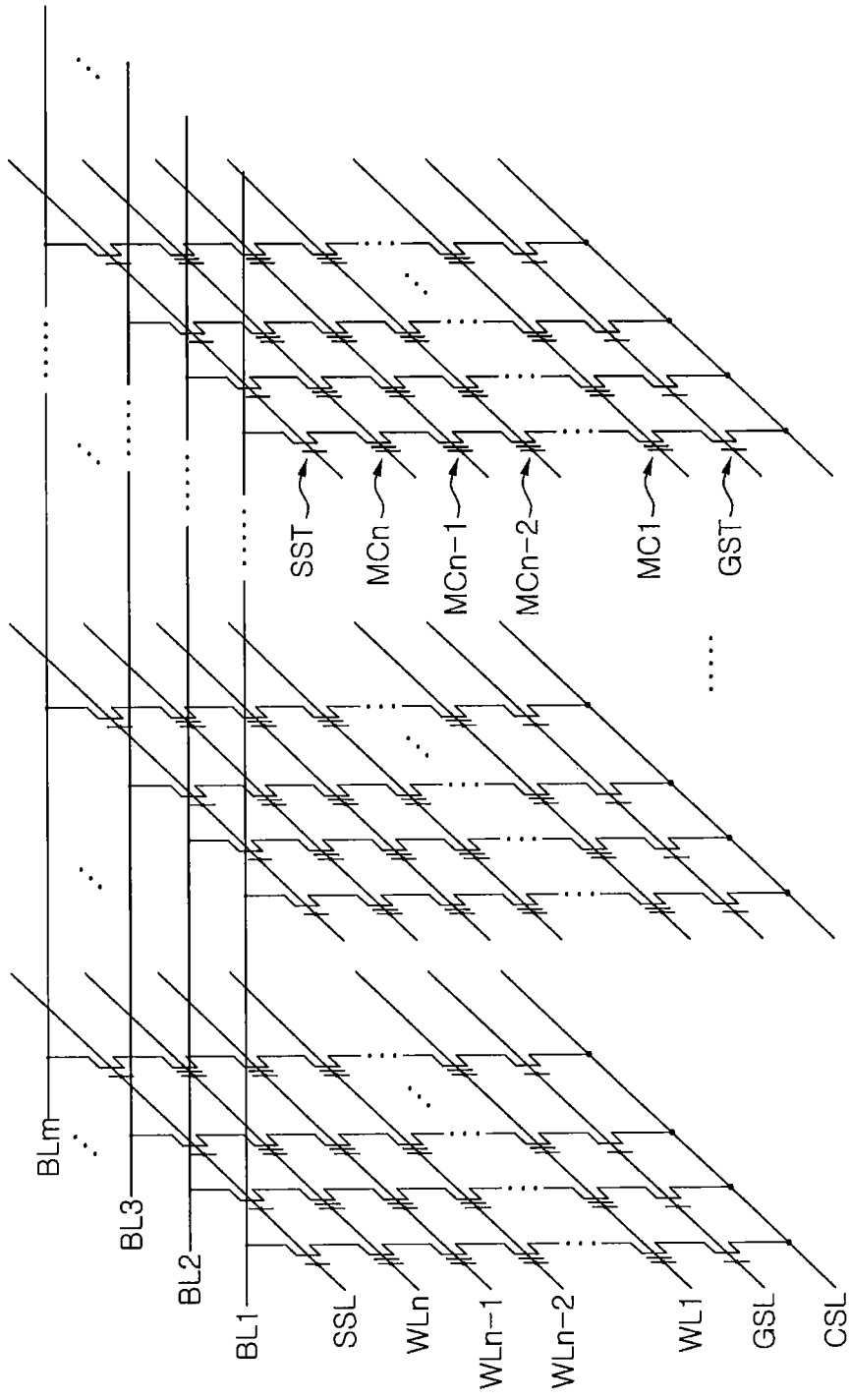
FIG. 2 is an equivalent circuit diagram of a memory cell array of a semiconductor device according to aspects of the present disclosure.

FIG. 2 is an equivalent circuit diagram of the memory cell array of the semiconductor device according to aspects of the present disclosure.

With reference to FIG. 2, the memory cell array may include n memory cell transistors MC1 to MCn connected in series, a ground select transistor (GST) connected to opposing ends of the memory cell transistors MC1 to MCn in series, and a plurality of memory cell strings including a string select transistor (SST).

N memory cell transistors MC1 to MCn connected in series may be connected to WLs WL1 to WLn, respectively, in order to select at least one portion of the memory cell transistors MC1 to MCn.

A gate terminal of the GST may be connected to the GSL, while a source terminal of the GST may be connected to the CSL. A gate terminal of the SST may be connected to the SSL, while the source terminal of the SST may be connected to a drain terminal of a memory cell transistor MCn. FIG. 2 illustrates a structure in which a single GST and a single SST are connected to n memory cell transistors MC1 to MCn connected in series. Alternatively, however, a plurality of GSTs or a plurality of SSTs may be connected thereto.

A drain terminal of the SST may be connected to BLs BL1 to BLm. In a case in which a signal is applied to the gate terminal of the SST through the SSL, a signal applied through the BLs BL1 to BLm may be transmitted to n memory cell transistors MC1 to MCn connected in series, so that a data reading operation or a data writing operation may be undertaken. In addition, a predetermined level of erasing voltage may be applied through a well region formed in a substrate, and thus an erasing operation to erase data stored in n memory cell transistors MC1 to MCn may be undertaken.

Figure 3:
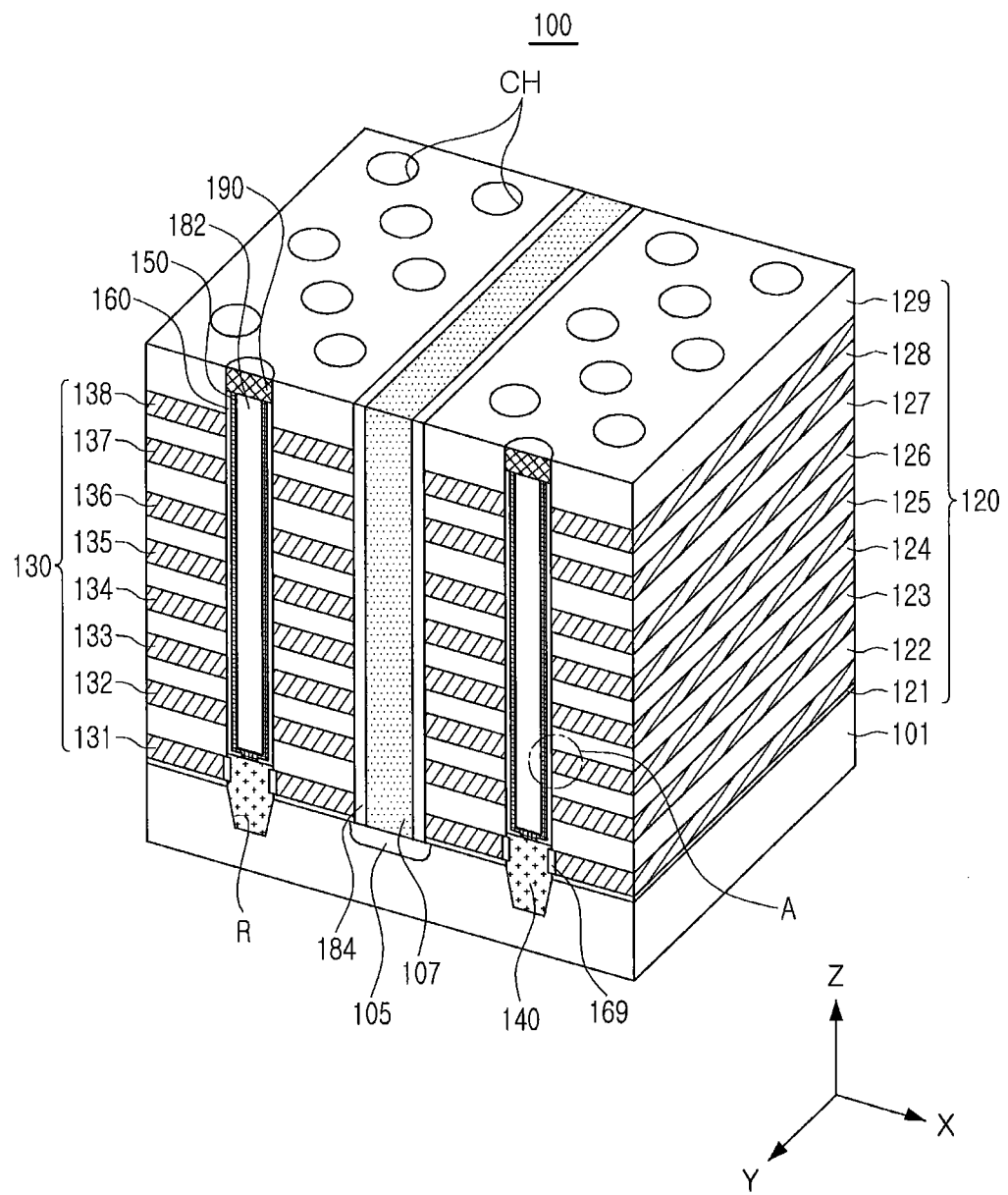
FIG. 3 is a schematic perspective view of a structure of memory cell strings of a semiconductor device according to aspects of the present disclosure.

FIG. 3 is a schematic perspective view of a structure of memory cell strings of a semiconductor device according to aspects of the present disclosure.

With reference to FIG. 3, a semiconductor device 100 may include a substrate 101, channel holes CH extended in a direction perpendicular to a top surface of the substrate 101, channel layers 150 disposed in the channel holes CH, and mold insulating layers 120 and gate electrodes 130, stacked along side walls of the channel holes CH. In addition, the semiconductor device 100 may further include epitaxial layers 140 disposed between the channel layers 150 and the substrate 101, gate dielectric layers 160 disposed between the channel layers 150 and the gate electrodes 130, a first insulating layer 182 disposed in the channel layers 150, conductive pads 190 disposed on the channel layers 150, a conductive layer 107 disposed between the gate electrodes 130, and an impurity region 105 disposed in the substrate 101 below the conductive layer 107.

In the semiconductor device 100, a single memory cell string may be disposed along a single channel layer 150. The semiconductor device 100 may include a plurality of memory cell strings disposed in X and Y directions.

The substrate 101 may include the top surface extended in the X and Y directions. The substrate 101 may include a semiconductor material, such as a group IV semiconductor, a group III-V compound semiconductor or a group II-VI compound semiconductor. For example, the group IV semiconductor may include silicon (Si), germanium (Ge), or silicon-germanium (SiGe). The substrate 101 may be provided as a bulk wafer or an epitaxial layer.

The gate electrodes 130 (e.g., gate electrodes 131 to 138) and the mold insulating layers 120 (e.g., mold insulating layers 121 to 129), may be alternately stacked on the substrate 101.

The gate electrodes 130 (e.g., gate electrodes 131 to 138) may be spaced apart from each other in a Z direction, from the substrate 101, along a side surface of respective channel layers 150. With reference to FIG. 2, respective gate electrodes 130 may be provided as a gate of a GST, memory cell transistors MC1 to MCn, and an SST. The gate electrode 130 may be extended to form WLs WL1 to WLn.

FIG. 3 illustrates an example in which five gate electrodes 132 to 136 of the memory cell transistors MC1 to MCn are disposed, but the present disclosure is not limited thereto. Depending on a capacity of the semiconductor device 100, the number of the gate electrodes 130 configuring the memory cell transistors MC1 to MCn may be determined. For example, the gate electrodes 130 configuring the memory cell transistors MC1 to MCn may be provided in an amount of tens to hundreds.

A gate electrode 131 of the GST may be extended in a Y direction to form a GSL. In order to operate the GST, a predetermined impurity may be doped in the substrate 101 below the gate electrode 131. Gate electrodes 137 and 138 of the SST may be extended in the Y direction to form an SSL. In addition, a portion of the gate electrodes 130, for example, the gate electrode 131 of the GST or the gate electrodes 130 disposed adjacently to the gate electrodes 137 and 138 of the SST, may be provided as a dummy gate electrode. In detail, a gate electrode 132 disposed adjacently to the gate electrode 131 of the GST may be provided as the dummy gate electrode.

The gate electrodes 130 may include a metal layer and a barrier layer. In detail, the metal layer may include tungsten (W). The barrier layer may be disposed to surround the metal layer. For example, the barrier layer may include at least one of a tungsten nitride (WN), a tantalum nitride (TaN), and a titanium nitride (TiN). In an example embodiment, the gate electrodes 130 may include polycrystalline silicon or a metallic silicide material. For example, the metallic silicide material may be provided as a silicide material including a metal selected from cobalt (Co), nickel (Ni), hafnium (Hf), platinum (Pt), W, and titanium (Ti).

The mold insulating layers 120 (e.g., mold insulating layers 121 to 129) may be disposed between the gate electrodes 130. In a manner the same as that of the gate electrodes 130, the mold insulating layers 120 may be disposed to be spaced apart from each other in a Z direction and to be extended in the Y direction. The mold insulating layers 120 may include an insulating material, such as a silicon oxide or a silicon nitride.

The channel layers 150 may penetrate through the gate electrodes 130 and the mold insulating layers 120 to be extended in the direction (Z direction) substantially perpendicular to the top surface of the substrate 101. In addition, the channel holes CH in which the channel layers 150 are disposed may have a form in which a diameter thereof is reduced in a direction toward the substrate 101. The channel layers 150 may be disposed to be spaced apart from each other in the X and Y directions. However, an array of the channel layers 150 may vary according to an example embodiment. In addition, the array of the channel layers 150 disposed adjacently to each other on opposite sides of the conductive layer 107 may be symmetrical, as illustrated in an example embodiment, but the present inventive concept is not limited thereto. The channel layers 150 may include a semiconductor material, such as polycrystalline silicon and single crystal silicon. In addition, the semiconductor material may be provided as an undoped material or a material including a p-type or an n-type impurity.

The gate dielectric layers 160 may be disposed between the gate electrodes 130 and the channel layers 150. A bottom portion of the gate dielectric layer 160 may have an L-shaped cross section. A detailed description of the gate dielectric layer 160 will be provided below, with reference to FIGS. 4A to 4C.

The epitaxial layer 140 may be disposed between the channel layer 150 and the substrate 101, and may be in contact with the channel layer 150 and the substrate 101. The channel layer 150 may be electrically connected to the substrate 101 through the epitaxial layer 140. The epitaxial layer 140 may be disposed in a recessed region R of the substrate 101, which may be below the top surface of the substrate 101. The epitaxial layer 140 may fill the recessed region R, and may be extended above the top surface of the substrate 101. In detail, a top surface of the epitaxial layer 140 may be higher than a top surface of a gate electrode 131 disposed in a bottom portion of the gate electrodes 130, and may be lower than a bottom surface of a gate electrode 132. The top surface of the epitaxial layer 140 may have a convex central portion. Although an aspect ratio of the channel layer 150 is increased by the epitaxial layer 140, the channel layer 150 may be stably electrically connected to the substrate 101, and properties of the GST (see FIG. 2) including the gate electrode 131 disposed in the bottom portion of the gate electrodes 130 may become uniform. The epitaxial layer 140 may be provided as a semiconductor material layer formed using a selective epitaxial growth (SEG) process. The epitaxial layer 140 may include Si, Ge, or SiGe. The epitaxial layer 140 may be doped with an impurity.

An insulating layer 169 may be disposed between the epitaxial layer 140 and the gate electrode 131. The insulating layer 169 may act as a gate insulating layer of the GST. The insulating layer 169 may be provided as an oxide formed in such a manner that a portion of the epitaxial layer 140 is oxidized. For example, the insulating layer 169 may be provided as a silicon oxide.

The conductive pad 190 may be disposed to cover a top surface of the first insulating layer 182 to be electrically connected to the channel layer 150. In detail, the conductive pad 190 may include doped polycrystalline silicon. The conductive pad 190 may act as a drain region of the SST (see FIG. 2). The conductive pad 190 may be electrically connected to the BL through a contact plug.

The impurity regions 105 may be extended in the Y direction, adjacent to the top surface of the substrate 101, and may be separated from each other at a predetermined interval in the X direction. The impurity region 105 may act as a source region of the GST (see FIG. 2).

The conductive layer 107 may be formed on and extended along the impurity region 105 in the Y direction. The conductive layer 107 may include a conductive material. For example, the conductive layer 107 may include tungsten (W), aluminum (Al), or copper (Cu). The conductive layer 107 may be electrically isolated from the gate electrodes 130 by a second insulating layer 184.

Figure 4A:
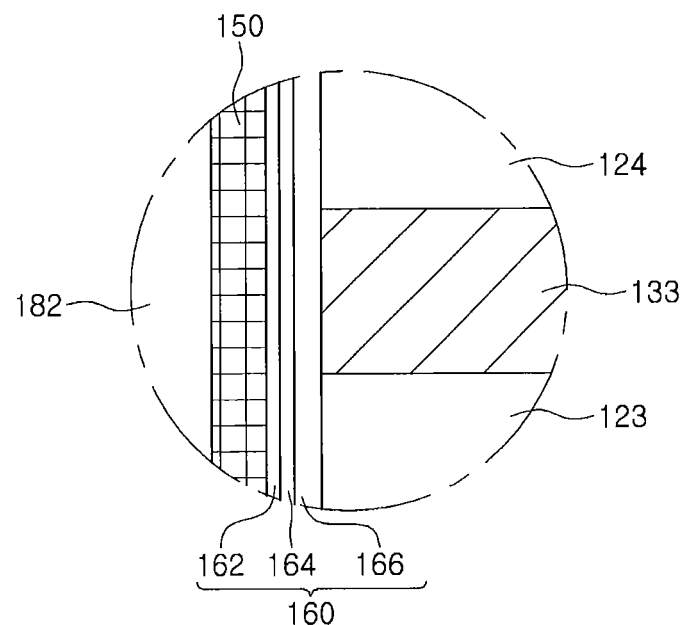
FIGS. 4A to 4C are cross-sectional views of a gate dielectric layer according to aspects of the present disclosure, and illustrate a region corresponding to region 'A' in FIG. 3.
Figure 4B:
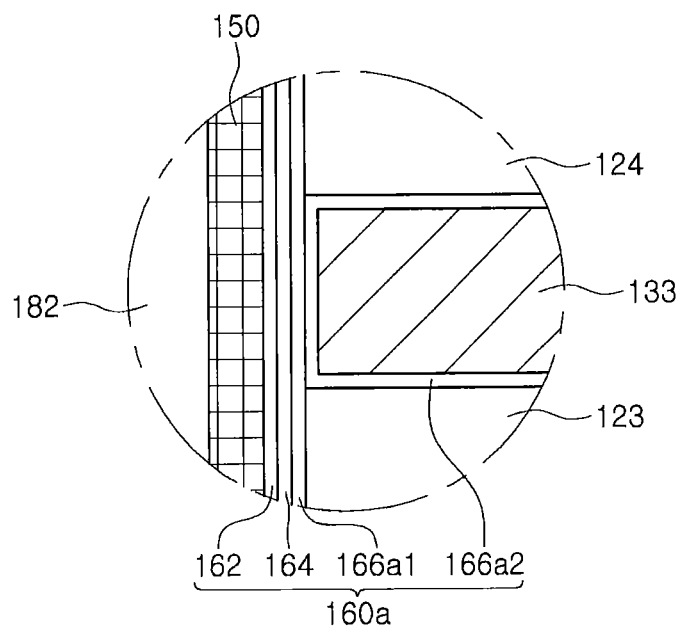
Figure 4C:
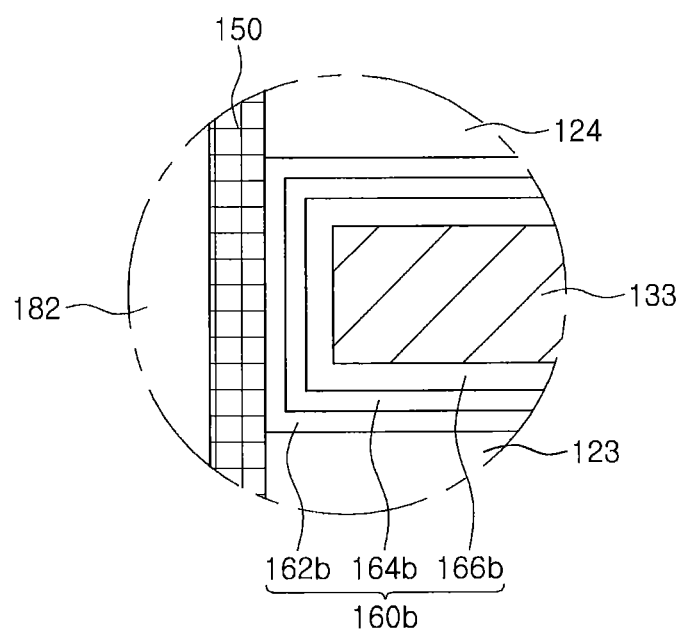

FIGS. 4A to 4C are cross-sectional views of a gate dielectric layer according to aspects of the present disclosure, and illustrate a region corresponding to region 'A' in FIG. 3.

In FIG. 4A, a gate electrode 133, a gate dielectric layer 160, a channel layer 150, and a first insulating layer 182 are illustrated. With reference to FIG. 3, the gate electrode 133 may be disposed between two mold insulating layers 120 (e.g., a first mold insulating layer 123 and a second mold insulating layer 124).

The gate dielectric layer 160 may include a tunneling layer 162, a charge storage layer 164, and a blocking layer 166, layered on the channel layer 150 in sequence. As an example, the gate dielectric layer 160 may be disposed in such a manner that an entirety of the tunneling layer 162, the charge storage layer 164, and the blocking layer 166 is extended in a vertical direction along the channel layer 150. A thickness of the layers configuring the gate dielectric layer 160 is not limited to the thickness illustrated in FIG. 4A, but may vary. In other words, the relative thicknesses of the tunneling layer 162, the charge storage layer 164, and the blocking layer 166 need not be as illustrated in FIG. 4A.

The tunneling layer 162 may allow a charge (e.g., an electron) to tunnel to the charge storage layer 164 using the Fowler-Nordheim (F-N) mechanism. In detail, the tunneling layer 162 may include a silicon oxide. The charge storage layer 164 may be provided as a charge trapping layer or a floating gate conductive layer. In detail, the charge storage layer 164 may include an insulating layer including a quantum dot or a nanocrystal. In this case, the quantum dot or the nanocrystal may include a conductive material, such as fine particles of a metal or a semiconductor. For example, the charge storage layer 164 may include a silicon nitride, silicon oxynitride, or Si-rich silicon nitride. The blocking layer 166 may include a silicon oxide, a silicon nitride, a silicon oxynitride, a high-k dielectric material or combinations thereof. The high-k dielectric material may be provided as one of an aluminum oxide ($Al_2O_3$), a tantalum oxide ($Ta_2O_3$), titanium dioxide ($TiO_2$), an yttrium oxide ($Y_2O_3$), zirconium dioxide ($ZrO_2$), a zirconium silicate ($ZrSi_xO_y$), a hafnium oxide ($HfO_2$), a hafnium silicate ($HfSi_xO_y$), a lanthanum oxide ($La_2O_3$), a lanthanum aluminum oxide ($LaAl_xO_y$), a lanthanum hafnium oxide ($LaHf_xO_y$), a hafnium aluminum oxide ($HfAl_xO_y$), and a praseodymium oxide ($Pr_2O_3$).

In FIG. 4B, a gate electrode 133, a gate dielectric layer 160a, a channel layer 150, and a first insulating layer 182 are illustrated. With reference to FIG. 3, the gate electrode 133 may be disposed between two mold insulating layers 120 (e.g., a first mold insulating layer 123 and a second mold insulating layer 124). The gate dielectric layer 160a may have a structure in which a tunneling layer 162, a charge storage layer 164, and blocking layers 166a1 and 166a2 are layered on the channel layer 150 in sequence. A thickness of the layers configuring the gate dielectric layer 160 is not limited to the thickness illustrated in an example embodiment, but may vary.

In a manner different from an example embodiment illustrated in FIG. 4A, in the case of the gate dielectric layer 160a, the blocking layers 166a1 and 166a2 may include two layers, a first blocking layer 166a1 may be vertically extended in a manner the same as the channel layer 150, and a second blocking layer 166a2 may be disposed to surround the gate electrode 133. In detail, the second blocking layer 166a2 may include a high-k dielectric material, while the first blocking layer 166a1 may include a silicon oxide.

In FIG. 4C, a gate electrode 133, a gate dielectric layer 160b, a channel layer 150, and a first insulating layer 182 are illustrated. With reference to FIG. 3, gate electrode 133 may be disposed between two mold insulating layers 120 (e.g., a first mold insulating layer 123 and a second mold insulating layer 124). The gate dielectric layer 160b may have a structure in which a tunneling layer 162b, a charge storage layer 164b, and a blocking layer 166b are layered on the channel layer 150 in sequence. In a manner different from example embodiments illustrated in FIGS. 4A and 4B, the gate dielectric layer 160b in the example embodiment may be disposed in such a manner that an entirety of the tunneling layer 162b, the charge storage layer 164b, and the blocking layer 166b surrounds the gate electrode 133.

Figure 5A:
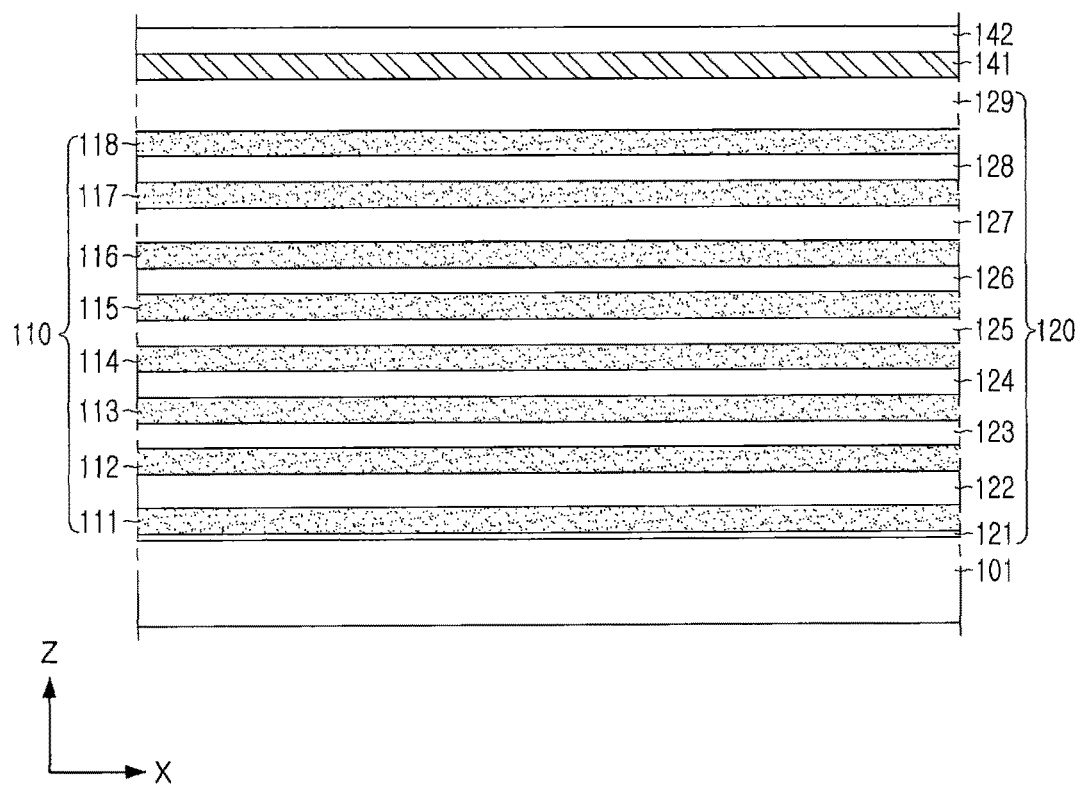
FIGS. 5A to 5N are schematic views of main operations, illustrating a method of manufacturing a semiconductor device according to aspects of the present disclosure.
Figure 5B:
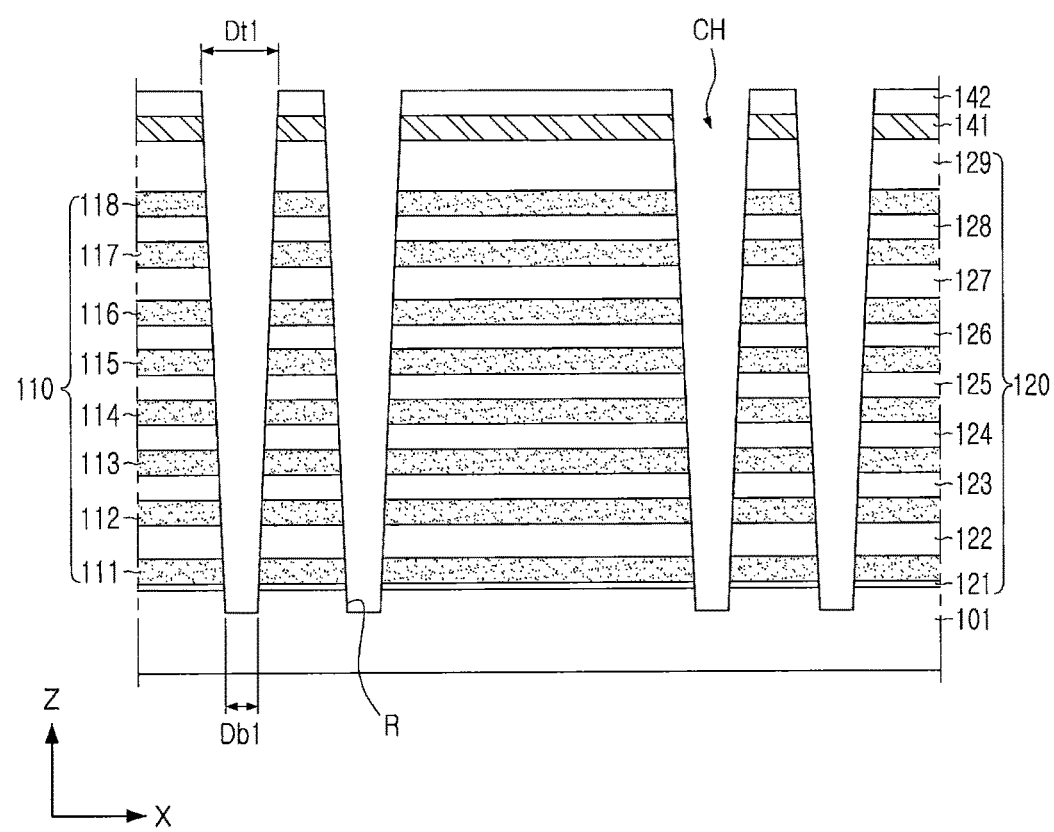
Figure 5C:
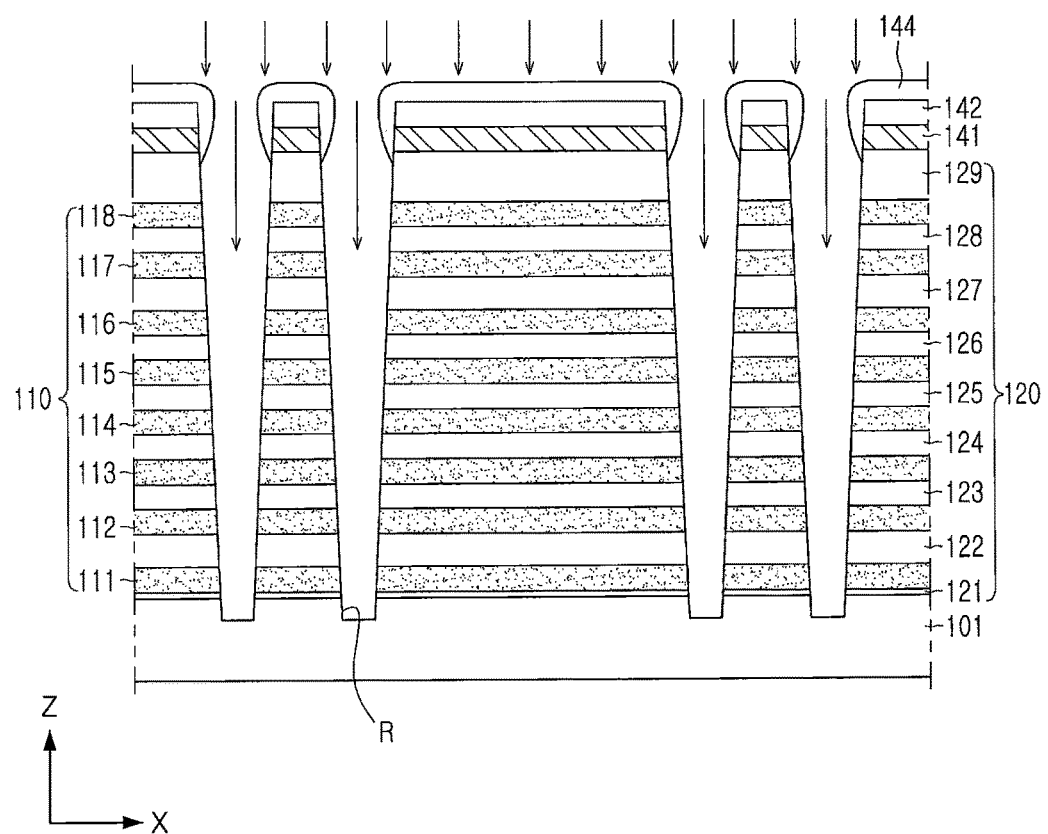
Figure 5D:
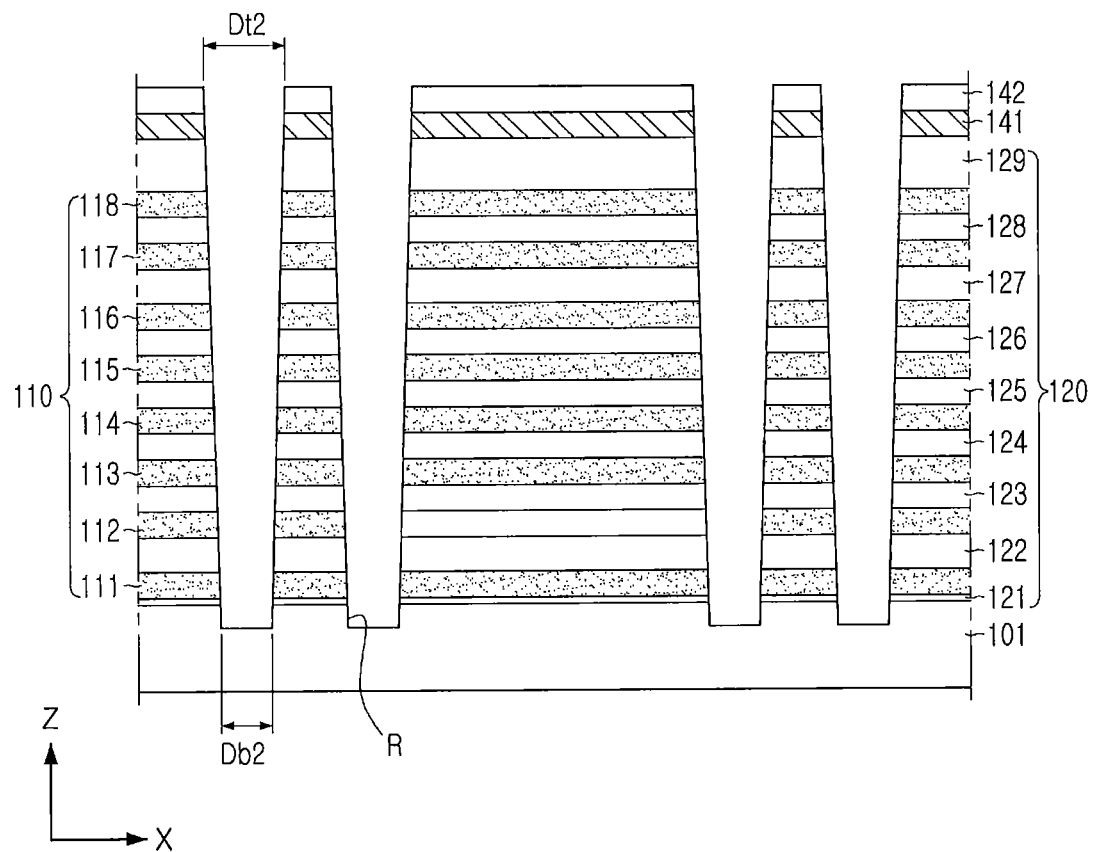
Figure 5E:
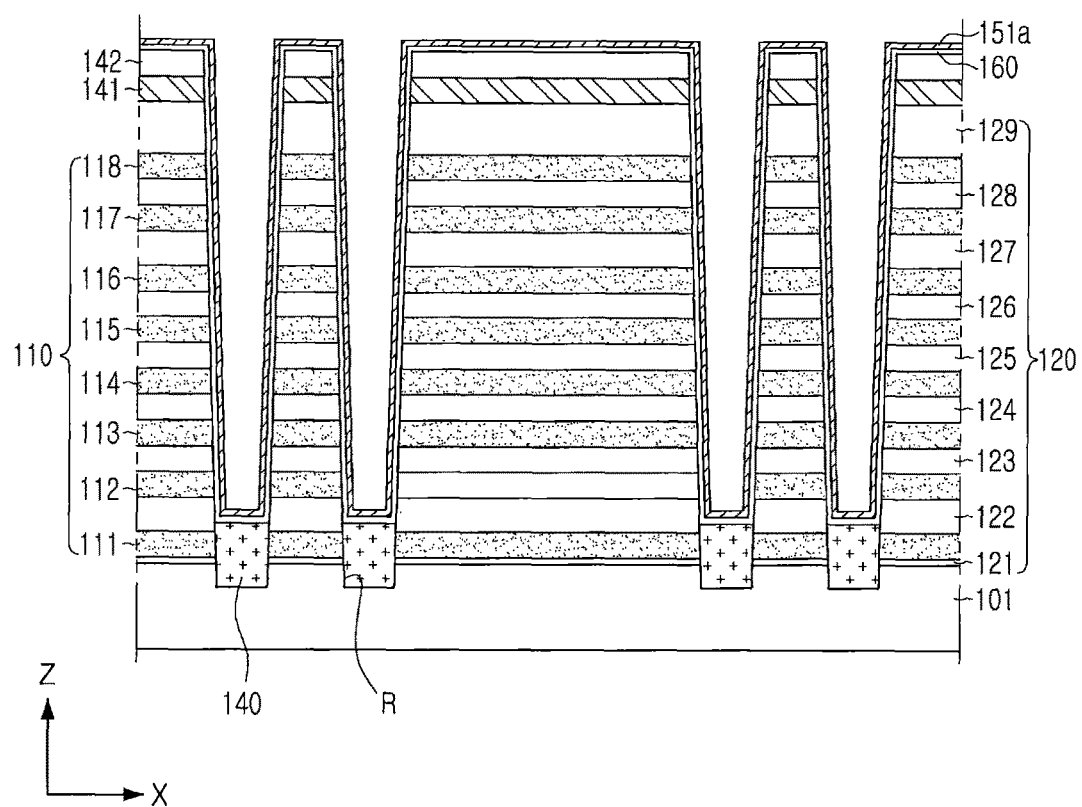
Figure 5F:
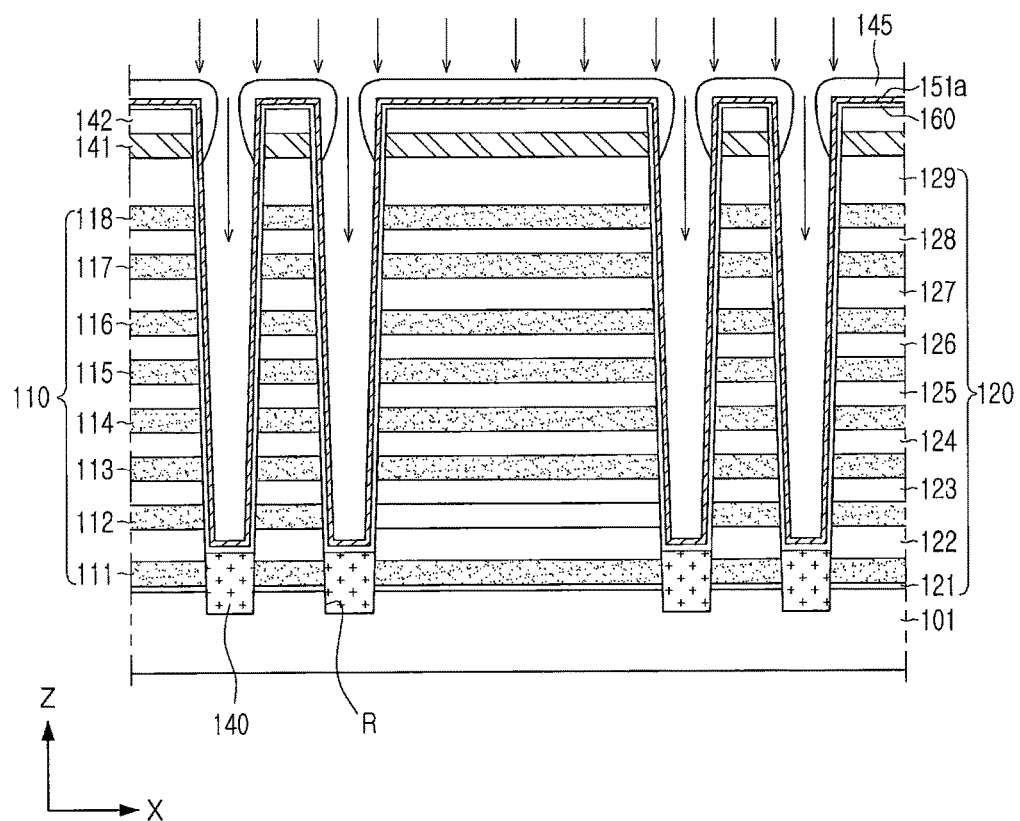
Figure 5G:
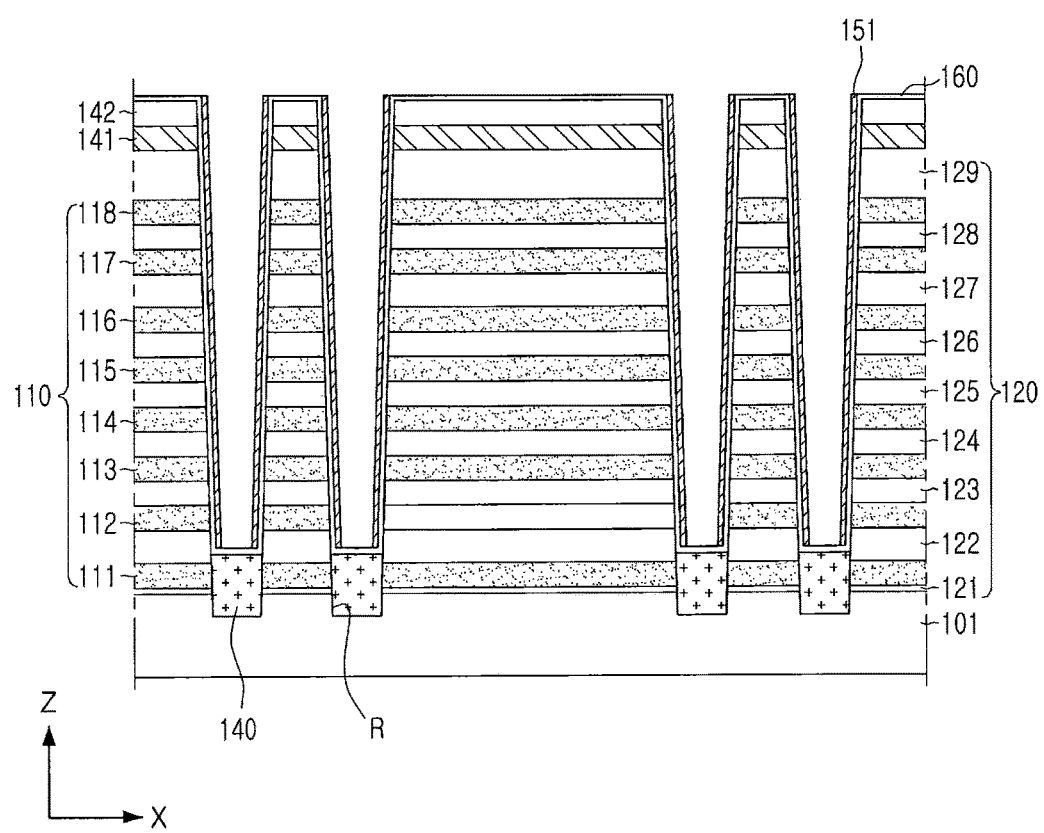
Figure 5H:
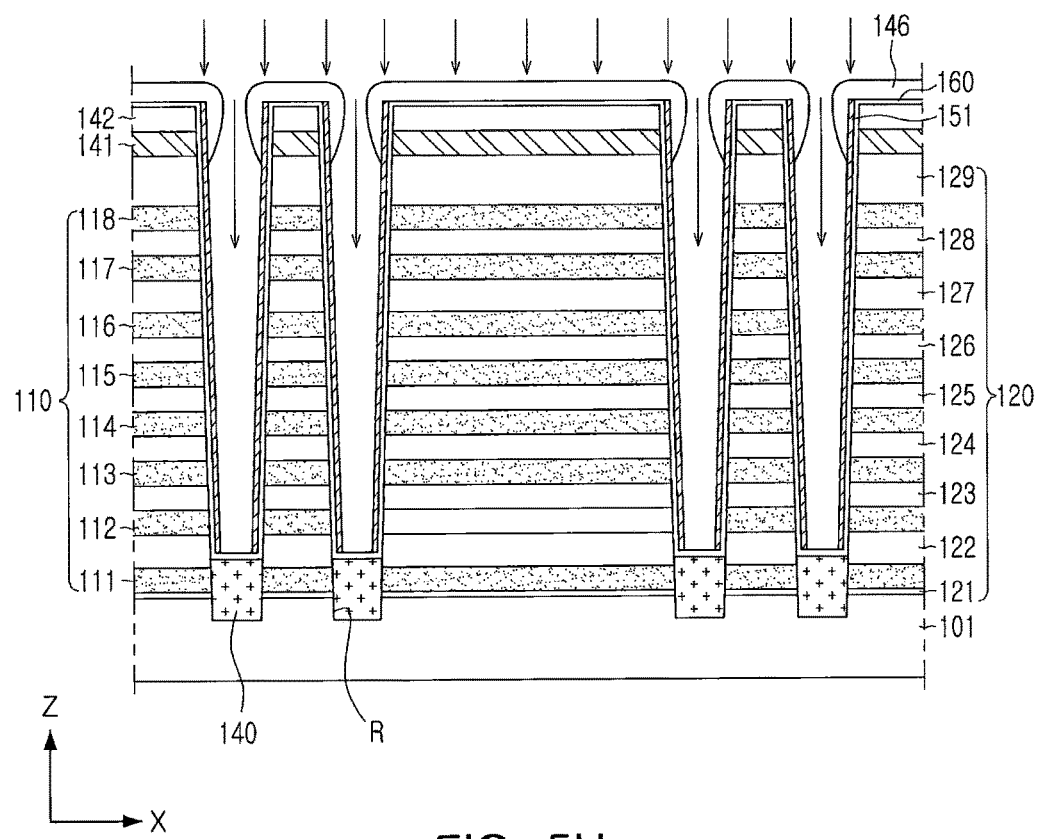
Figure 5I:
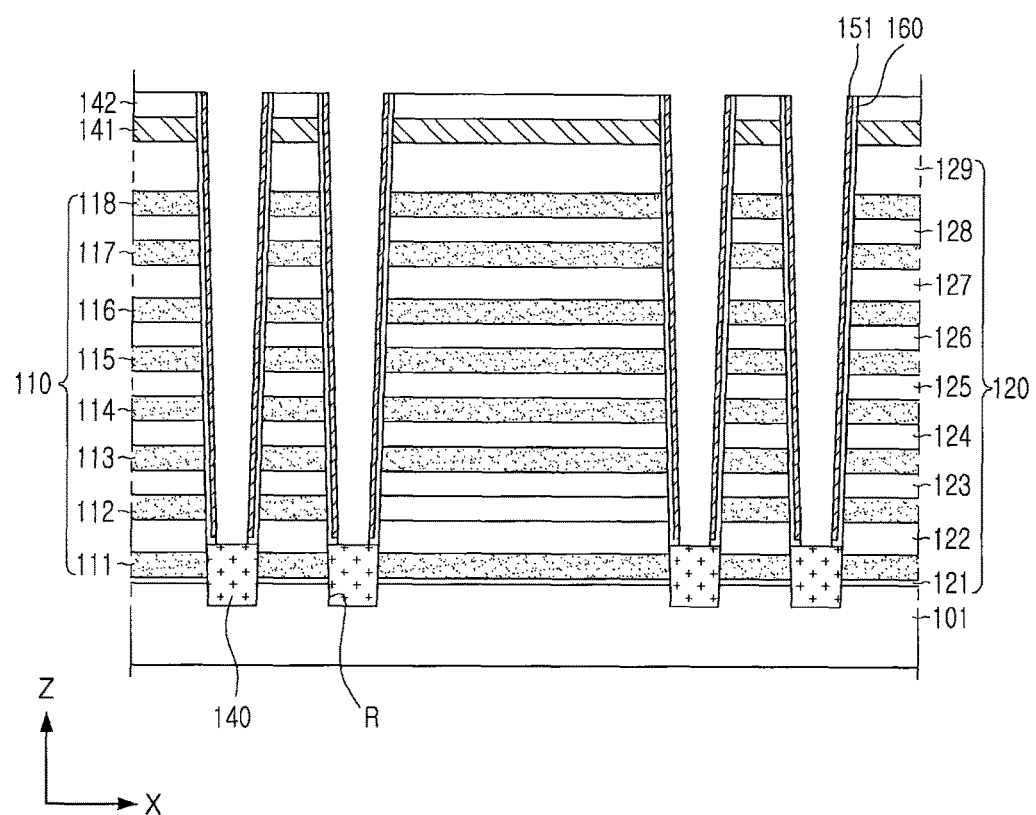
Figure 5J:
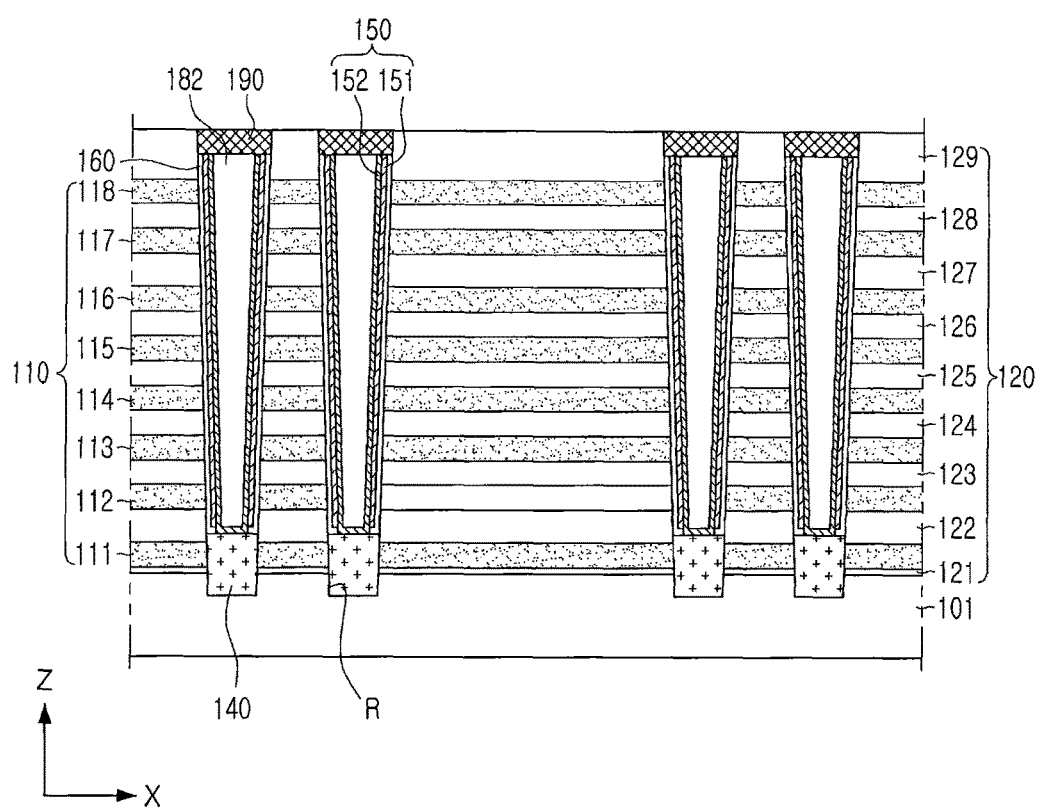
Figure 5K:
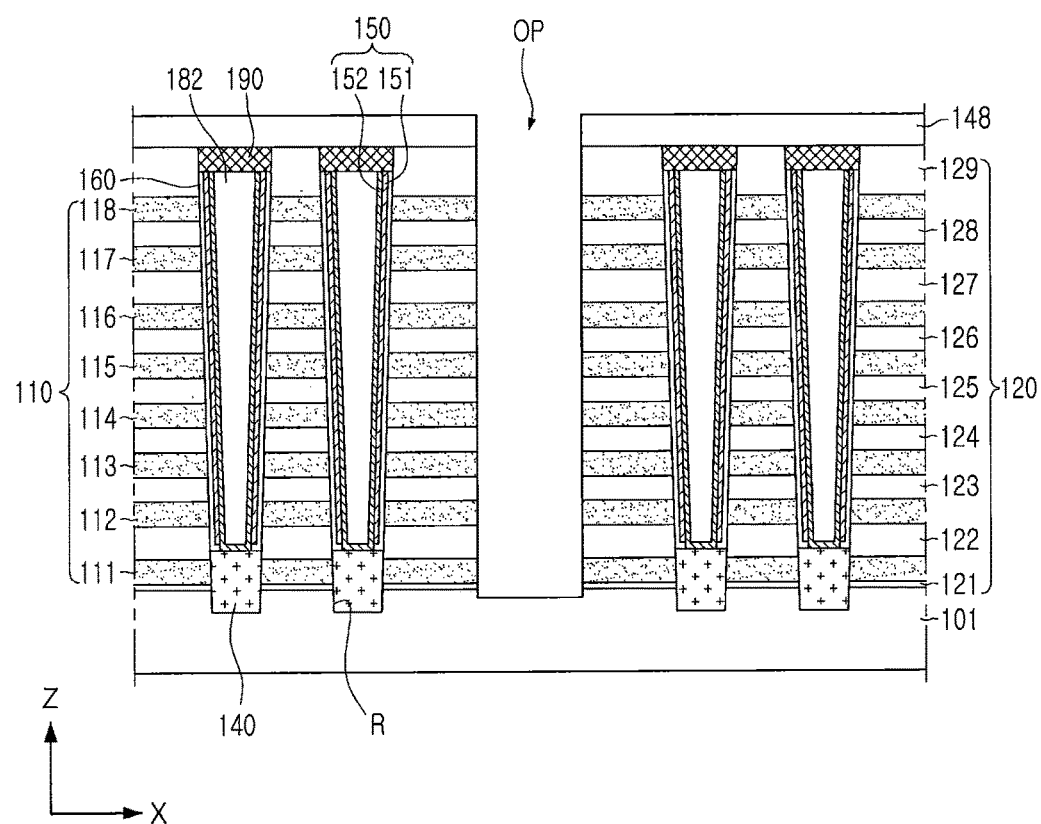
Figure 5L:
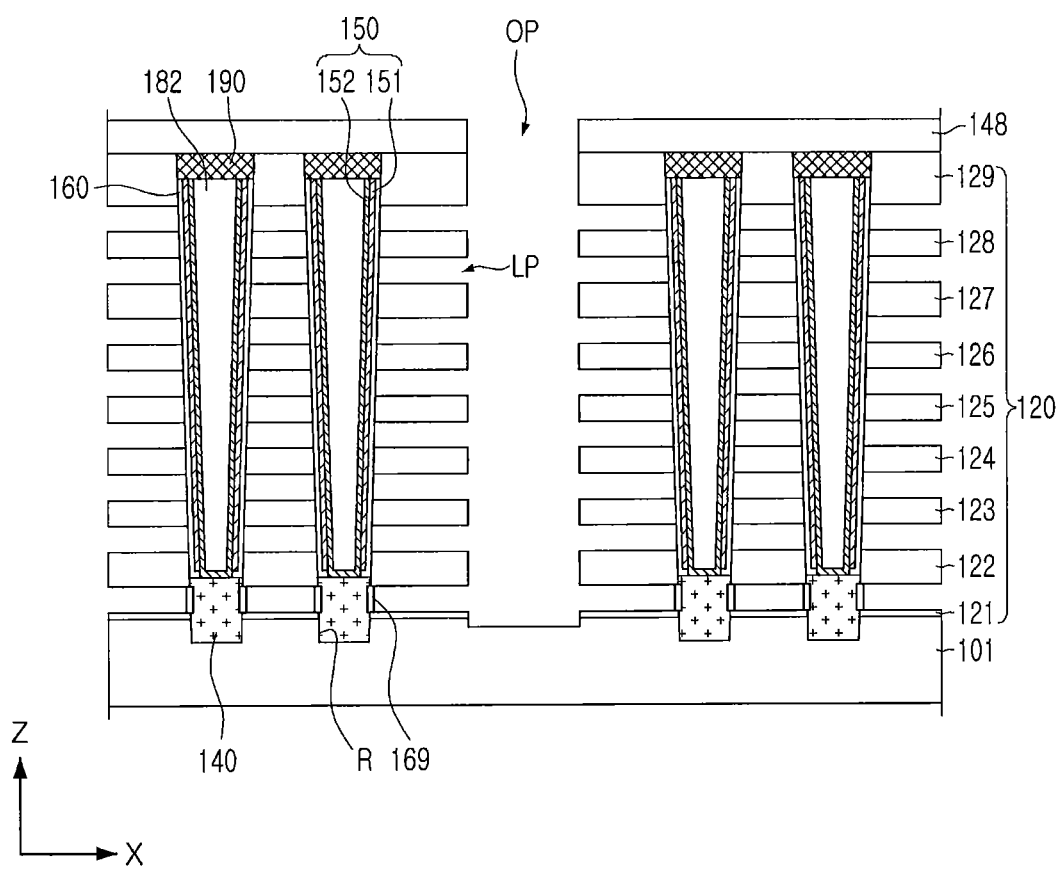
Figure 5M:
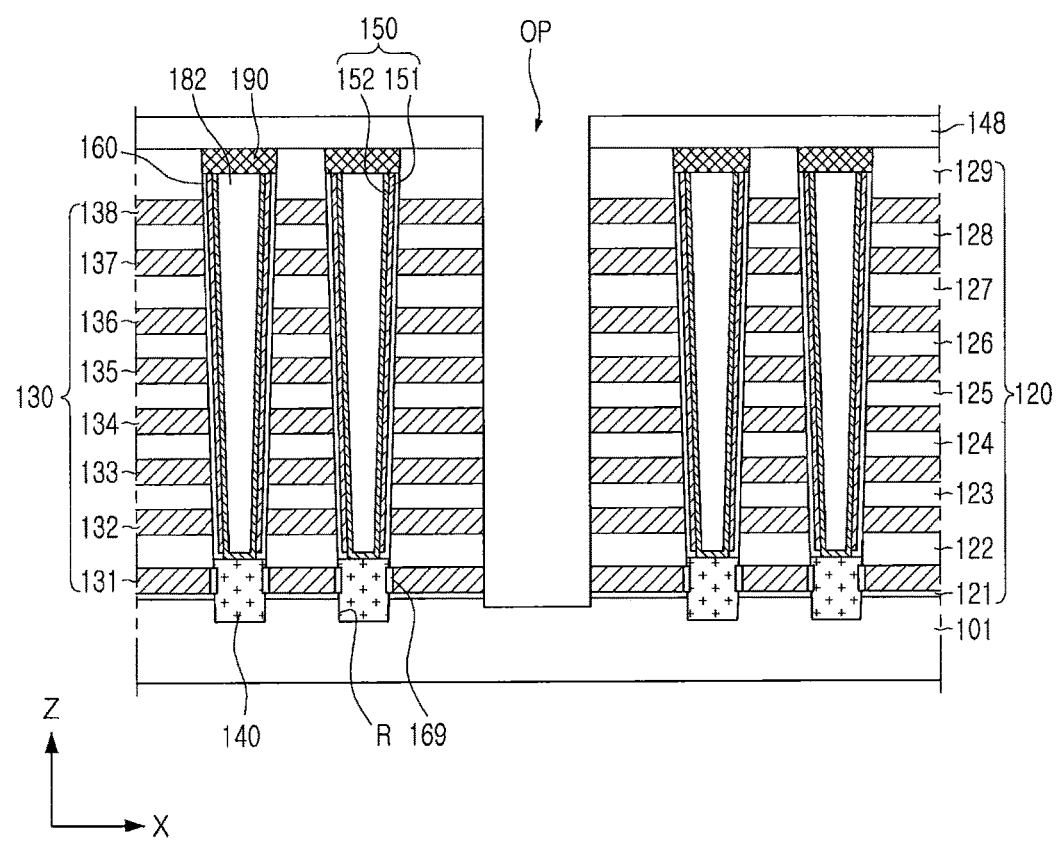
Figure 5N:
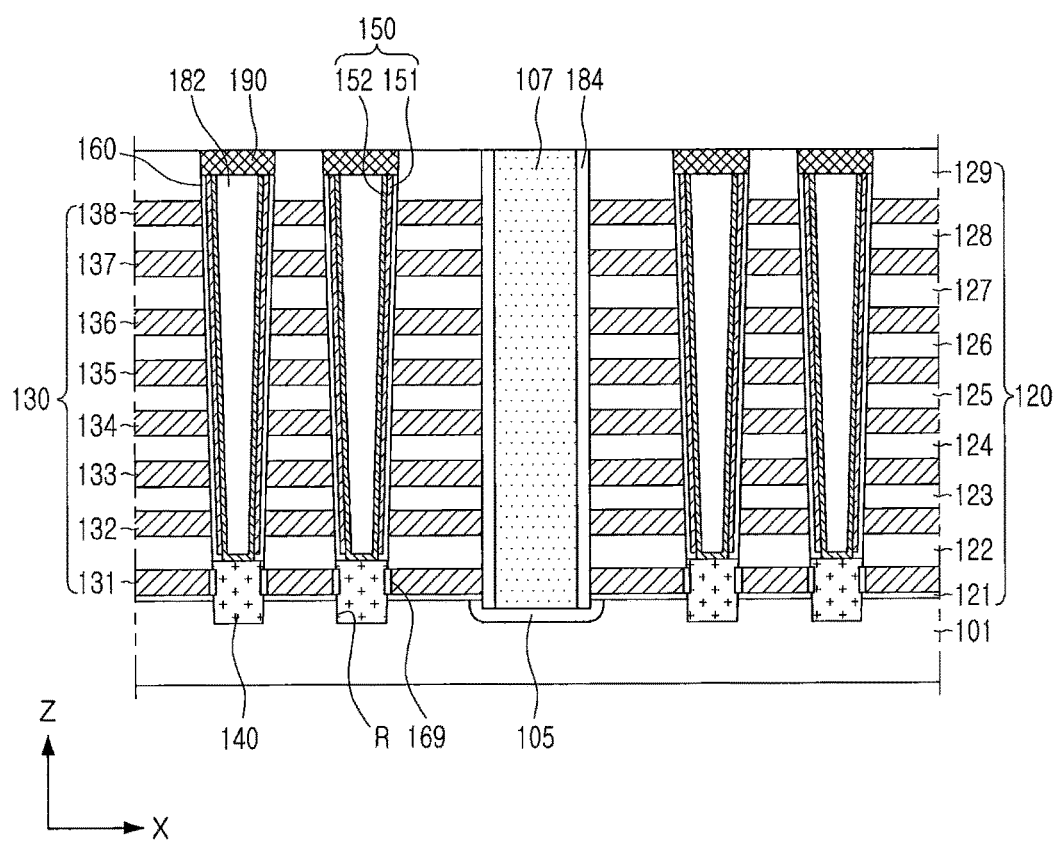

FIGS. 5A to 5N are schematic views of main operations, illustrating a method of manufacturing a semiconductor device according to aspects of the present disclosure. FIGS. 5A to 5N illustrate a region corresponding to an X-Z cross section in a perspective view of FIG. 3.

With reference to FIG. 5A, sacrificial layers 110 (e.g., sacrificial layers 111 to 118) and mold insulating layers 120 may be alternately stacked on a substrate 101. As illustrated, the mold insulating layers 120 and the sacrificial layers 110 may be alternately stacked on the substrate 101, starting from a mold insulating layer 121. In addition, a buffer layer 141 and a mask layer 142 may be further formed on a mold insulating layer 129 disposed in a top portion of the mold insulating layers 120.

The sacrificial layers 110 may include a material to be etched, having etching selectivity with respect to the mold insulating layers 120. For example, the mold insulating layers 120 may include at least one of a silicon oxide and a silicon nitride. In addition, the sacrificial layers 110 may include a material different from that of the mold insulating layers 120, selected from silicon, a silicon oxide, silicon carbide, and a silicon nitride.

As illustrated, thicknesses of the mold insulating layers 120 in an example embodiment may not be the same. The mold insulating layer 121 disposed in a bottom portion of the mold insulating layers 120 may be formed to be relatively thin, while the mold insulating layer 129 disposed in the top portion of the mold insulating layers 120 may be formed to be relatively thick. In addition, mold insulating layers 122 and 127 may be formed to be thicker than mold insulating layers 123 to 126. However, thicknesses of the mold insulating layers 120 and the sacrificial layers 110 may vary in a manner different from that illustrated in FIG. 5A. In addition, the number of films configuring the mold insulating layers 120 and the sacrificial layers 110 may also vary.

The buffer layer 141 may include a silicon oxynitride film or a silicon nitride film. The buffer layer 141 may be used as a stopping layer in a chemical mechanical polishing (CMP) process performed subsequently. The buffer layer 141 may include a mask layer 142 formed thereon. The mask layer 142 may be used as a hard mask in an etching process performed subsequently. The mask layer 142 may include a silicon oxide film.

With reference to FIG. 5B, channel holes CH penetrating through the sacrificial layers 110 and the mold insulating layers 120 may be formed.

The channel holes CH may be formed in such a manner that the mask layer 142 is patterned, and the buffer layer 141, the sacrificial layers 110, and the mold insulating layers 120 are etched through an anisotropic dry etching process using a patterned mask layer 142 as an etching mask. The channel holes CH may be extended to the substrate 101 in a Z direction, and thus a recessed region R may be formed in the substrate 101. A side wall of the channel holes CH may not be perpendicular to a top surface of the substrate 101. In detail, a width of the channel hole CH may be reduced in a direction toward the top surface of the substrate 101.

The channel holes CH may have a width (or a diameter) reduced in a direction toward the substrate 101. As an aspect ratio of the channel hole CH is increased, the diameter of the channel hole CH may be significantly reduced. A width (or a diameter) DU of an upper portion of the channel holes CH may be greater than a width (or a diameter) Db1 of a lower portion of the channel holes CH.

The width (or the diameter) Dt1 of the upper portion of the channel holes CH may be provided as a width (or a diameter) of an open portion of the mask layer 142. In addition, the width (or the diameter) Db1 of the lower portion of the channel holes CH may be provided as a width (or a diameter) of the recessed region R. In other words, a width of the channel hole CH may be greater near the mask layer 142 and the buffer layer 141 than a width of the channel hole CH near the mold insulating layer 121 and the substrate 101.

With reference to FIG. 5C, a surface of the recessed region R may be cleaned.

A process of cleaning the surface of the recessed region R may include processes of forming a first protective layer 144 in an upper region of the channel holes CH and performing the anisotropic dry etching process on the surface of the recessed region R.

The processes of forming the first protective layer 144 and performing the anisotropic dry etching process on the surface of the recessed region R may be performed in an etching chamber, in-situ. The processes of forming the first protective layer 144 and performing the anisotropic dry etching process on the surface of the recessed region R may be alternately repeated one or more times.

The first protective layer 144 may cover a side wall in the upper portion of the channel holes CH, thus allowing the open portion in the upper region of the channel holes CH to be narrowed. Therefore, during an etching process, ions generated by plasma in the etching chamber may be accelerated toward the substrate 101. In addition, the first protective layer 144 may screen a portion of the ions (arrows in FIG. 5C) reaching the upper region of the channel holes CH to protect the side wall in the upper portion of the channel holes CH from the ions, and may allow the remainder of the ions to penetrate toward the lower portion of the channel holes CH to etch an damaged and contaminated surface of the recessed regions R. In this case, a side wall in a middle portion of the channel holes CH may also be etched.

The first protective layer 144 may be provided as a film containing carbon (C) or silicon (Si). For example, the first protective layer 144 may be provided as a film based on C, $CH_x$, $C_xF_y$, and $CH_xF_y$, or $SiO_x$ and $SiClO_x$.

In an example embodiment, an operation of forming the first protective layer 144 may be omitted.

With reference to FIG. 5D, the process of cleaning the surface of the recessed region R may be completed, and the first protective layer 144 may be removed. For example, in a case in which the first protective layer 144 is provided as a film containing C, the first protective layer 144 may be removed using an ashing process.

In the operation, a width (or a diameter) Dt2 of the upper portion of the channel holes CH may be substantially the same as the width (or the diameter) Dt1 (See FIG. 5B) of the upper portion of the channel holes CH. In addition, a width (or a diameter) Db2 of the lower portion of the channel holes CH may be greater than the width (or the diameter) Db1 (See FIG. 5B.) of the lower portion of the channel holes CH. In other words, a width (or a diameter) of the upper portion of the channel holes CH may remain the same, while a width (or a diameter) of the recessed region R may be increased, as ions that have not been screened by the first protective layer 144 etch the lower region or lower regions of the channel holes CH including the recessed region R.

On the surface of the recessed region R of the substrate 101, a region contaminated by an impurity (e.g., C, nitrogen (N), or the like) and an oxide film may be formed due to a process of etching the channel holes CH. Therefore, during a process of forming an epitaxial layer using an SEG process later, a defect, such as a void, may occur. The void may cause a reliability problem in the semiconductor device. Therefore, an etching process of removing a contaminated region and the oxide film on the surface of the recessed region R may be performed. In a case in which the width of the upper portion of the channel holes CH is substantially increased, a bridging fault in which the channel holes CH disposed adjacently to each other are connected may occur.

Since in the example embodiment, the width of the upper portion of the channel holes CH may remain the same, and the surface of the recessed region R in the lower portion of the channel holes CH may be cleaned, the epitaxial layer may be grown without a void occurring later.

With reference to FIG. 5E, an epitaxial layer 140 may be formed in the recessed region R in the lower portion of the channel holes CH. In addition, a gate dielectric layer 160 and a first semiconductor layer 151a may be formed in the channel holes CH.

The epitaxial layer 140 may be formed in such a manner that the SEG process is performed using the substrate 101 in the recessed region R as a seed. The epitaxial layer 140 may have a single layer structure or a multilayer structure having different growth conditions or different compositions. The epitaxial layer 140 may be doped with an impurity. The impurity may be provided as a conductive impurity, the same as or opposed to the impurity of the substrate 101.

A top surface of the epitaxial layer 140 may be formed to be higher than a top surface of a sacrificial layer 111 disposed adjacently to the substrate 101. In addition, the top surface of the epitaxial layer 140 may be formed to be convex in a direction away from the substrate 101.

The gate dielectric layer 160 may be formed on the side wall of the channel hole CH, the top surface of the epitaxial layer 140, and a top surface of the mask layer 142 to have a uniform thickness. The gate dielectric layer 160 may include a blocking layer, a charge storage layer, and a tunneling layer, layered in sequence. The first semiconductor layer 151a may be formed on the gate dielectric layer 160 to have a uniform thickness. The first semiconductor layer 151a may include a semiconductor material, such as polycrystalline silicon and amorphous silicon. For example, the first semiconductor layer 151a may be provided as polycrystalline silicon. The gate dielectric layer 160 and the first semiconductor layer 151a may be formed using an atomic layer deposition (ALD) method or a chemical vapor deposition (CVD) method.

With reference to FIGS. 5F and 5G, the gate dielectric layer 160 may include a spacer 151 formed thereon.

A process of forming the spacer 151 may include processes of forming a second protective layer 145 in the upper region of the channel holes CH and performing an anisotropic dry etching process on the first semiconductor layer 151a.

The processes of forming the second protective layer 145 and performing the anisotropic dry etching process on the first semiconductor layer 151a may be performed in the etching chamber, in-situ. The processes of forming the second protective layer 145 and performing the anisotropic dry etching process on the first semiconductor layer 151a may be alternately repeated one or more times.

The second protective layer 145 may cover a side wall in the upper portion of the channel holes CH, thus allowing the open portion in the upper region of the channel holes CH to be narrowed. In a manner similar to the first protective layer 144 described above, the second protective layer 145 may screen a portion of the ions (arrows in FIG. 5F) reaching the upper region of the channel holes CH to protect the first semiconductor layer 151a and the mask layer 142 in the upper region of the channel holes CH from the ions, and may allow the remainder of the ions to penetrate toward the lower region of the channel holes CH to etch the first semiconductor layer 151a in the lower portion of the channel holes CH.

In a manner similar to the first protective layer 144, the second protective layer 145 may be provided as a film containing C or Si. For example, the second protective layer 145 may be provided as a film based on C, $CH_x$, $C_xF_y$, and $CH_xF_y$, or $SiO_x$, and $SiClO_x$.

The spacer 151 may be formed on a side wall of the gate dielectric layer 160 in such a manner that the first semiconductor layer 151a is anisotropically etched. The spacer 151 may allow a portion of the gate dielectric layer 160 formed on the top surface of the epitaxial layer 140 in the lower portion of the channel hole CH to be exposed.

With reference to FIGS. 5H and 5I, in a subsequent process, in order to allow a channel layer 150 to be in direct contact with the epitaxial layer 140, a portion of the gate dielectric layer 160 may be removed from the channel holes CH.

A process of removing a portion of the gate dielectric layer 160 from the channel holes CH may include processes of forming a third protective layer 146 in the upper region of the channel holes CH and performing an anisotropic dry etching process on the gate dielectric layer 160 using the spacer 151 as an etching mask.

The processes of forming the third protective layer 146 and performing the anisotropic dry etching process on the gate dielectric layer 160 may be alternately repeated in the etching chamber one or more times, in-situ.

The third protective layer 146 may cover the side wall of the upper portion of the channel holes CH, thus allowing the open portion in the upper region of the channel holes CH to be narrowed. In a manner similar to the second protective layer 145, the third protective layer 146 may play a role to protect the spacer 151 and the mask layer 142.

In a manner similar to the first protective layer 144, the third protective layer 146 may be provided as a film containing C or Si. For example, the third protective layer 146 may be provided as a film based on C, $CH_x$, $C_xF_y$, and $CH_xF_y$, or $SiO_x$ and $SiClO_x$.

The gate dielectric layer 160 anisotropically etched using the spacer 151 as an etching mask may have an L-shaped cross section.

In a case in which the gate dielectric layer 160 is etched, a portion of the top surface of the epitaxial layer 140 may be etched together.

In the example embodiment, in operations of forming the spacer 151 and removing a portion of the gate dielectric layer 160, a thickness of the mask layer 142 may be reduced due to the second protective layer 145 or the third protective layer 146. Therefore, in the example embodiment, a processing time and production costs may be reduced.

The operations of forming the spacer 151 and removing a portion of the gate dielectric layer 160, described with reference to FIGS. 5F to 5I, may be performed in the same etching chamber in sequence.

In an example embodiment, an operation of forming the second protective layer 145 or the third protective layer 146 may be omitted.

With reference to FIG. 5J, the channel layer 150 may be formed in the channel holes CH. In addition, a first insulating layer 182 filling the channel holes CH and a conductive pad 190 on the first insulating layer 182 may be formed.

The channel layer 150 may be formed in such a manner that a second semiconductor layer 152 connected to the epitaxial layer 140 is formed in the channel holes CH.

The second semiconductor layer 152 may be formed on the gate dielectric layer 160 using the ALD method or the CVD method to have a uniform thickness. The second semiconductor layer 152 may include a semiconductor material, such as polycrystalline silicon and amorphous silicon.

The first insulating layer 182 may fill the remainder of a space of the channel holes CH may be formed.

A portion of the first insulating layer 182 in the upper region of the channel holes CH may be etched, and thus space in which the conductive pad 190 is disposed may be formed. The space may be filled with a semiconductor material, and a planarization process (e.g. CMP process) to allow the mold insulating layer 129 disposed in the top portion of the mold insulating layers 120 to be exposed, thus forming the conductive pad. In this case, the buffer layer 141 and the mask layer 142 may be removed.

The first insulating layer 182 may be provided as an insulating material, such as a silicon oxide. The conductive pad 190 may be provided as a doped semiconductor material.

With reference to FIG. 5K, an opening OP allowing a laminate of the sacrificial layers 110 and the mold insulating layers 120 to be spaced from each other by a predetermined interval may be formed. Before the opening OP is formed, an additional capping insulating layer 148 may be formed on the conductive pad 190 and the mold insulating layer 129 disposed in the top portion of the mold insulating layers 120. The capping insulating layer 148 may prevent damage to the conductive pad 190, the channel layer 150, and the like, during a subsequent process. The opening OP may be formed in such a manner that the capping insulating layer 148, the sacrificial layers 110, and the mold insulating layers 120 are anisotropically etched. The opening OP may be formed to have a trench form extended in a Y direction (see FIG. 3). The opening OP may allow the substrate 101 to be exposed between the channel layers 150.

With reference to FIG. 5L, the sacrificial layers 110 exposed through the opening OP may be removed using a selective etching process. Thus, a plurality of lateral openings LP disposed between the mold insulating layers 120 may be formed. In detail, in a case in which the sacrificial layers 110 are provided as a silicon nitride, and the mold insulating layers 120 are provided as a silicon oxide, the selective etching process may be performed using an etchant including phosphoric acid. Through the lateral openings LP, a portion of side walls of the gate dielectric layer 160 and the epitaxial layer 140 may be exposed.

Subsequently, an insulating layer 169 may be formed on the epitaxial layer 140 exposed through the lateral openings LP.

In detail, the insulating layer 169 may be formed using an oxidation process. In this case, the insulating layer 169 may be provided as an oxide film formed in such a manner that a portion of the epitaxial layer 140 is oxidized. A thickness and a form of the insulating layer 169 are not limited to an example embodiment.

In a case in which the oxidation process is performed in the operation, damage that the gate dielectric layer 160 exposed through the lateral openings LP receives during a process of etching the sacrificial layer 110 may be cured.

With reference to FIG. 5M, a gate electrode 130 may be formed in the lateral openings LP.

The gate electrode 130 may include a metal layer and a barrier layer. The barrier layer may be formed on surfaces of the gate dielectric layer 160, the insulating layer 169, the mold insulating layer 120, and the substrate 101, exposed through the openings OP and the lateral openings LP. Subsequently, the metal layer may be formed to fill the lateral openings LP. In an example embodiment, a diffusion barrier may be omitted. The metal layer may include W, while the barrier layer may include WN, TaN, TiN or combinations thereof.

Subsequently, in order to allow the gate electrode 130 to only be disposed in the lateral opening LP, the barrier layer and the metal layer, formed in the opening OP, may be removed through an additional process.

With reference to FIG. 5N, an impurity region 105 may be formed in the substrate 101 in the opening OP, while a conductive layer 107 and a second insulating layer 184 may be formed on the impurity region 105.

First, an impurity may be injected into the substrate 101 exposed through the opening OP, thus forming the impurity region 105. Subsequently, the second insulating layer 184 may be formed on a side wall of the opening OP, and the conductive layer 107 may be formed. Subsequently, the planarization process, such as the CMP process, may be performed to allow the conductive pad 190 to be exposed.

In an example embodiment, the impurity region 105 may be formed after the second insulating layer 184 is formed. The impurity region 105 may be configured to include regions having different impurity concentrations.

Subsequently, a contact plug connected to the conductive pad 190 may be further disposed, and a BL connected to the contact plug may be formed, which is not illustrated.

Figure 6:
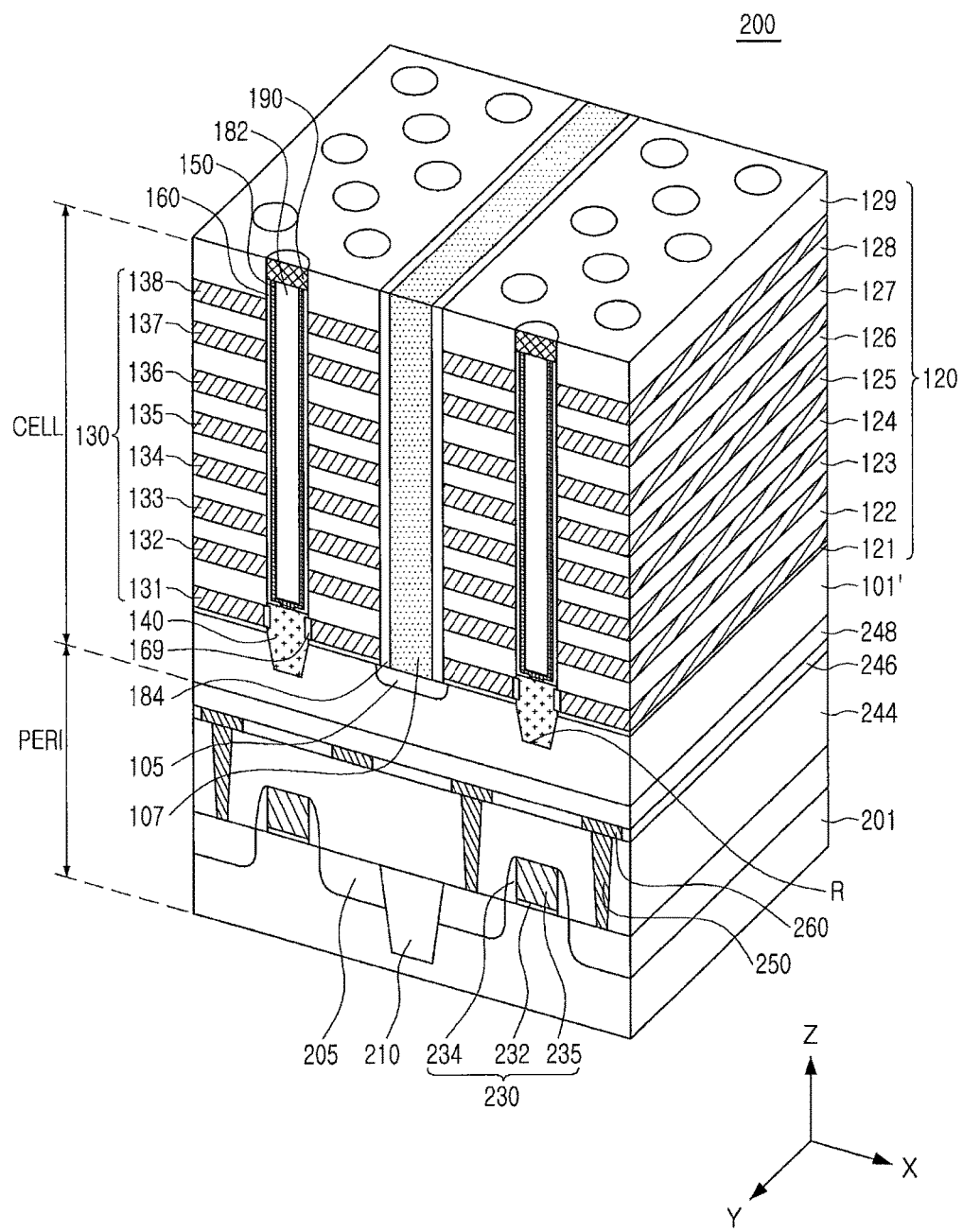
FIG. 6 is a schematic perspective view of a structure of a semiconductor device according to aspects of the present disclosure.

FIG. 6 is a schematic perspective view of a structure of a semiconductor device according to aspects of the present disclosure.

With reference to FIG. 6, a semiconductor device 200 may include a cell region CELL and a peripheral circuit region PERI.

The cell region CELL may correspond to a region in which a memory cell array 20 from FIG. 1 is disposed, while the peripheral circuit region PERI may correspond to a region in which a row decoder 30 and a core logic circuit 55 in FIG. 1 are disposed. The cell region CELL may be disposed on the peripheral circuit region PERI. In an example embodiment, the cell region CELL may be disposed below the peripheral circuit region PERI.

The cell region CELL may include a substrate 101', a plurality of channel layers 150 disposed in a direction perpendicular to a top surface of the substrate 101', and a plurality of mold insulating layers 120 and a plurality of gate electrodes 130, stacked along a side wall of the channel layers 150. In addition, the cell region CELL may further include an epitaxial layer 140 disposed on the substrate 101' in a lower portion of the channel layer 150, a gate dielectric layer 160 disposed between the channel layer 150 and a gate electrode 130, a conductive layer 107 disposed on an impurity region 105, and a conductive pad 190 disposed on the channel layer 150.

In the example embodiment, the cell region CELL is illustrated as having a structure the same as that of an example embodiment in FIG. 3, but the present disclosure is not limited thereto.

The peripheral circuit region PERI may include a base substrate 201 and circuit devices 230, contact plugs 250, and wiring lines 260, disposed on the base substrate 201.

The base substrate 201 may include a top surface extended in X and Y directions. The base substrate 201 may include an active region defined by a device isolation layer 210. In a portion of the active region, a doped region 205 including an impurity may be disposed. The base substrate 201 may include a semiconductor material, such as a group IV semiconductor, a group III-V compound semiconductor, or a group II-VI compound semiconductor. For example, the group IV semiconductor may include Si, Ge, or SiGe. The base substrate 201 may also be provided as a bulk wafer or an epitaxial layer.

A circuit device 230 may include various types of field effect transistors. Respective circuit devices 230 may include a circuit gate insulating layer 232, a spacer layer 234, and a circuit gate electrode 235. The doped region 205 may be disposed in the base substrate 201 on two sides of the circuit gate electrode 235, and may act as a source region or a drain region of the circuit device 230.

A plurality of peripheral region insulating layers 244, 246, and 248 may be disposed on the circuit device 230 on the base substrate 201.

The contact plugs 250 may penetrate through the peripheral region insulating layer 244 to be connected to the doped region 205. An electrical signal may be applied to the circuit device 230 through the contact plugs 250. In a region not illustrated, the contact plugs 250 may be connected to the circuit gate electrode 235. The wiring lines 260 may be connected to the contact plugs 250, and may be disposed to have a multilayer structure in an example embodiment.

The peripheral circuit region PERI may first be manufactured, and the substrate 101' of the cell region CELL may be formed in an upper portion thereof, so that the cell region CELL may be manufactured. The substrate 101' may be formed to have a size equal to or smaller than that of the base substrate 201. The substrate 101' may be formed of polycrystalline silicon, or may be formed of amorphous silicon to be crystallized.

The cell region CELL and the peripheral circuit region PERI may be connected in a region not illustrated. For example, an end portion of the gate electrode 130 in a Y direction may be electrically connected to the circuit device 230.

Since the cell region CELL and the peripheral circuit region PERI may be disposed in an upper portion and in a lower portion of the semiconductor device 200, the semiconductor device 200 in the example embodiment may be provided as a miniaturized device.

As set forth above, according to example embodiments of the present inventive concept, a method of manufacturing semiconductor devices having improved reliability may be provided.

While example embodiments have been shown and described above, it will be apparent to those skilled in the art that modifications and variations could be made without departing from the scope of the present inventive concept as defined by the appended claims.

What is claimed is:

1. A method of manufacturing a semiconductor device, comprising:
    alternately stacking mold insulating layers and sacrificial layers on a substrate;
    forming a plurality of channel holes penetrating through the mold insulating layers and the sacrificial layers and allowing a plurality of recessed regions to be formed in the substrate;
    cleaning a surface of the plurality of recessed regions, wherein processes of forming a first protective layer in an upper region of the channel holes and performing an anisotropic dry etching process on the plurality of recessed regions in a lower portion of the channel holes are alternately repeated one or more times, in-situ;
    forming epitaxial layers on the plurality of recessed regions of the substrate using the substrate in the plurality of recessed regions as seed;
    forming a gate dielectric layer and a first semiconductor layer, covering a side wall of each of the channel holes and a top surface of the epitaxial layers;
    forming a spacer on the gate dielectric layer, wherein processes of forming a second protective layer in the upper region of the channel holes and performing the anisotropic dry etching process on the first semiconductor layer are alternately repeated one or more times, in-situ;
    removing a portion of the gate dielectric layer on the top surface of the epitaxial layers, wherein processes of forming a third protective layer in the upper region of the channel holes and performing the anisotropic dry etching process on the gate dielectric layer using the spacer as an etching mask are alternately repeated one or more times, in-situ; and forming second semiconductor layers connected to the epitaxial layer in the channel holes.

2. The method of claim 1, wherein the forming of the spacer and the removing of a portion of the gate dielectric layer are performed in the same etching chamber in sequence.

3. The method of claim 1, further comprising:
forming a mask layer on the mold insulating layers and the sacrificial layers,
wherein the channel holes penetrate through the mask layer.

4. The method of claim 3, wherein in the forming of the spacer and the removing of a portion of the gate dielectric layer, the second protective layer and the third protective layer prevent the mask layer from being etched.

5. The method of claim 1, further comprising:
forming insulating layers filling a remaining portion of a space of the channel holes; and
forming conductive pads connected to the second semiconductor layers on the insulating layers.

6. The method of claim 1, wherein the gate dielectric layer comprises a charge trapping layer including a silicon nitride or a silicon oxynitride.

7. A method of manufacturing a semiconductor device, comprising:
alternately stacking mold insulating layers and sacrificial layers on a substrate;
forming channel holes penetrating through the mold insulating layers and the sacrificial layers and allowing recessed regions to be formed in the substrate;
cleaning a surface of the recessed regions in such a manner that processes of forming a first protective layer in an upper region of the channel holes and performing an anisotropic dry etching process on the recessed regions are alternately repeated one or more times, in-situ;
forming an epitaxial layer in the recessed regions of the substrate;
forming a gate dielectric layer and a first semiconductor layer, covering a side wall of the channel holes and a top surface of the epitaxial layer;
forming a spacer on the gate dielectric layer in such a manner that processes of forming a second protective layer in the upper region of the channel holes and performing the anisotropic dry etching process on the first semiconductor layer are alternately repeated one or more times, in-situ;
removing a portion of the gate dielectric layer on the top surface of the epitaxial layer in such a manner that processes of forming a third protective layer in the upper region of the channel holes and performing the anisotropic dry etching process on the gate dielectric layer using the spacer as an etching mask are alternately repeated one or more times, in-situ; and
forming second semiconductor layers connected to the epitaxial layer in the channel holes.

8. The method of claim 7, wherein the first protective layer, the second protective layer, and the third protective layer are provided as a film containing C or Si.

9. The method of claim 7, further comprising:
forming insulating layers filling a remaining portion of a spacer of the channel holes; and
forming conductive pads connected to the second semiconductor layers on the insulating layers.

* * * * *